United States Patent
Chen

(10) Patent No.: US 12,258,492 B2
(45) Date of Patent: Mar. 25, 2025

(54) POLISHING COMPOSITION, POLISHING METHOD, AND METHOD FOR MANUFACTURING SUBSTRATE

(71) Applicant: FUJIMI INCORPORATED, Aichi (JP)

(72) Inventor: Jingzhi Chen, Taiwan (CN)

(73) Assignee: FUJIMI INCORPORATED, Aichi (JP)

(*) Notice: Subject to any disclaimer, the term of this patent is extended or adjusted under 35 U.S.C. 154(b) by 0 days.

(21) Appl. No.: 18/377,466

(22) Filed: Oct. 6, 2023

(65) Prior Publication Data
US 2024/0043720 A1   Feb. 8, 2024

Related U.S. Application Data

(62) Division of application No. 17/096,358, filed on Nov. 12, 2020, now abandoned.

(30) Foreign Application Priority Data

Oct. 20, 2019   (JP) .................. 2019-209538

(51) Int. Cl.
    C09G 1/02       (2006.01)
    C09K 13/00      (2006.01)
    H01L 21/321     (2006.01)

(52) U.S. Cl.
    CPC ............ *C09G 1/02* (2013.01); *C09K 13/00* (2013.01); *H01L 21/3212* (2013.01)

(58) Field of Classification Search
    CPC ........ C09G 1/02; C09K 13/00; C09K 3/1409; C09K 3/1472; C09K 3/1454; H01L 21/3212; H01L 21/31053; H01L 21/30625; B24B 1/00; B24B 37/044
    USPC .............. 438/690–693; 51/307–309
    See application file for complete search history.

(56) References Cited

U.S. PATENT DOCUMENTS

| | | | | |
|---|---|---|---|---|
| 10,876,020 B2 * | 12/2020 | Ahn | ....... | B24B 37/044 |
| 2014/0199841 A1 | 7/2014 | Noller et al. | | |
| 2017/0247574 A1 * | 8/2017 | Takahashi | ............ | C09K 3/1436 |
| 2018/0002571 A1 * | 1/2018 | Stender | ............... | H01L 21/3212 |
| 2020/0299545 A1 | 9/2020 | Matsumoto et al. | | |
| 2020/0369917 A1 | 11/2020 | Otsuka et al. | | |

FOREIGN PATENT DOCUMENTS

| | | | | |
|---|---|---|---|---|
| JP | 201719978 A | 1/2017 | | |
| TW | 201311842 A | 3/2013 | | |
| TW | 201910481 A | 3/2019 | | |
| TW | 201920534 A | 6/2019 | | |
| WO | WO-2019030865 A1 * | 2/2019 | ............. | B24B 37/00 |
| WO | 2019044978 A1 | 3/2019 | | |

OTHER PUBLICATIONS

PubChem, Polyglycerin-6 (Year: 2005).*
Second Office Action for CN Application No. 202011306706.2, with a mailing date of Dec. 4, 2023.
Notice of Reasons for Refusal for JP Application No. 2020-185763, with a mailing date of Jun. 6, 2024.
Rejection Decision for CN Application No. 202011306706.2, with a mailing date of May 11, 2024.
Office Action for TW Application No. 109139484, with a mailing date of May 2, 2024.

* cited by examiner

*Primary Examiner* — Duy Vu N Deo
(74) *Attorney, Agent, or Firm* — Katten Muchin Rosenman LLP

(57) ABSTRACT

Provided are a polishing composition, a polishing method, and a method for manufacturing a substrate.

The polishing composition contains polishing abrasive grains, an additive molecule, a pH adjusting agent, and a dispersing medium. The polishing abrasive grains contain silica particles, and the silanol group density on the surface of the silica particles is 0 to 3.0 groups/nm². The silanol group density is calculated and determined based on the specific surface area measured by the BET method and the amount of silanol groups measured by titration. The pH adjusting agent is used to adjust the pH of the polishing composition to a range of 1.5 or more and 4.5 or less. The additive molecule has a structure represented by Formula (I).

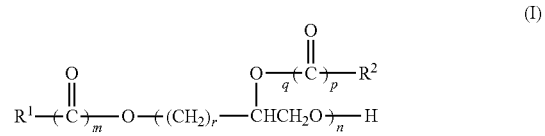

(In Formula (I), $R^1$, $R^2$, n, m, p, q, and r are as defined in the specification.)

13 Claims, No Drawings

POLISHING COMPOSITION, POLISHING METHOD, AND METHOD FOR MANUFACTURING SUBSTRATE

CROSS-REFERENCE TO RELATED APPLICATION

Background

1. Technical Field

The present invention relates to a polishing composition, a polishing method using this polishing composition, and a method for manufacturing a substrate.

2. Description of Related Arts

In the semiconductor industry, planarization technologies to improve the flatness of the surface of semiconductor substrates (for example, wafers) are typically used. Chemical mechanical polishing (CMP) is one of the planarization technologies commonly used. The chemical mechanical polishing technique includes a method in which the surface of an object to be polished (workpiece) such as a semiconductor substrate is flattened using a polishing composition containing abrasive grains such as silica, alumina, or ceria, an anticorrosive, a surfactant and the like.

Furthermore, substrates formed of semiconductor materials such as silicon or silicon-germanium (sometimes abbreviated as "silicon-containing materials" in the present specification) have already been widespread. Accordingly, the need for a polishing composition applied to polish a substrate containing a silicon-containing material has also gradually increased.

Taiwan Patent Application Publication No. 201311842 A1No. 201311842 discloses a chemical mechanical polishing composition containing (A) inorganic particles, organic particles, or a mixture or composite thereof, (B) at least one kind of oxidizing agent, and (C) an aqueous medium. The chemical mechanical polishing composition of Taiwan Patent Application No. 201311842 A1 can be applied to perform chemical mechanical polishing on elemental germanium or silicon-germanium.

SUMMARY

The demand for chemical mechanical polishing process has been more and more severe in association with the miniaturization of semiconductor devices. For example, in semiconductor devices, semiconductor elements are usually separated from each other using a shallow trench isolation (STI) structure formed of an oxide (for example, silicon oxide). In the shallow trench isolation step, excess oxide materials formed on the substrate can be removed by performing chemical mechanical polishing. In order to stop chemical mechanical polishing, it is common to form a polishing stop layer having a relatively low polishing speed between the oxide layer and the substrate. In addition, in order to accurately stop chemical mechanical polishing at a desired position, it is necessary to increase the polishing selectivity of the oxide layer to the polishing stop layer. Materials often used in the polishing stop layer may include nitrides, carbides, carbonitrides and the like, for example, silicon nitride.

When forming an oxide layer on a substrate formed of a silicon-containing material (for example, a silicon-germanium substrate or a silicon substrate), a further polishing stop layer (for example, a silicon nitride layer) may not be formed if the polishing selectivity of the oxide to the substrate material can be increased. In this case, the complexity of process can be simplified and the time and cost required for production can be decreased. In addition, if the polishing speed (in the present specification, "polishing speed" may be referred to as "removal rate") of the oxide can be increased, the time required for the polishing step can be significantly shortened and eventually the production efficiency of product increases.

However, in the existing polishing compositions, it is still difficult to increase the polishing selectivity (in the present specification, "polishing selectivity" may be referred to as "polishing speed ratio" or a "removal rate ratio") of oxides to silicon-containing materials (for example, silicon-germanium or silicon) to a sufficient degree. In other words, it is still difficult to use silicon-germanium or silicon as a polishing stop layer when performing chemical mechanical polishing on oxides.

The present invention has been completed in view of the actual circumstances described above, and an object thereof is to provide a polishing composition capable of increasing the polishing speed ratio of an oxide to silicon-germanium or silicon. Furthermore, the polishing composition provided by the present invention can also increase the polishing speed of an oxide. In addition, the present invention provides a polishing method using this polishing composition and a method for manufacturing a substrate.

In order to achieve the above object, several embodiments of the present invention provide a polishing composition as described below, a polishing method using this polishing composition, and a method for manufacturing a substrate.

[1] A polishing composition contains polishing abrasive grains which contain silica particles and in which a silanol group density on a surface of the silica particles is 0 to 3.0 groups/nm$^2$ and the silanol group density is calculated and determined based on a specific surface area measured by a BET method and an amount of silanol groups measured by titration; an additive molecule; a pH adjusting agent used to adjust a pH of the polishing composition to a range of 1.5 or more and 4.5 or less; and a dispersing medium. The additive molecule has a structure represented by Formula (I).

[Chem. 1]

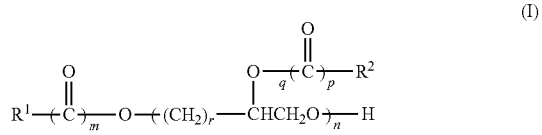

In Formula (I), $R^1$ and $R^2$ are each independently H, a $C_1$ to $C_{18}$ linear alkyl group, a $C_3$ to $C_{18}$ branched alkyl group, or a $C_2$ to $C_{18}$ linear alkenyl group; n is an integer 2 to 40; and m, p, and q are each independently 0 or 1 and r is an integer 0 to 2, $R^1$ is a $C_1$ to $C_{18}$ linear alkyl group, a $C_3$ to $C_{18}$ branched alkyl group, or a $C_2$ to $C_{18}$ linear alkenyl group when m is 1, and $R^2$ is a $C_1$ to $C_{18}$ linear alkyl group, a $C_3$ to $C_{18}$ branched alkyl group, or a $C_2$ to $C_{18}$ linear alkenyl group when p is 1.

[2] In the polishing composition according to [1], a content of the additive molecule is 50 to 10,000 ppm by weight with respect to a total weight of the polishing composition.

[3] In the polishing composition according to [1] or [2], a weight average molecular weight of the additive molecule is 100 to 10000.

[4] In the polishing composition according to any one of [1] to [3], in Formula (I), $R^1$ is H and $R^2$ is a $C_1$ to $C_{18}$ linear alkyl group, a $C_3$ to $C_{18}$ branched alkyl group, or a $C_2$ to $C_{18}$ linear alkenyl group; n is an integer 2 to 20; and m, p, q, and r are all 0.

[5] In the polishing composition according to any one of [1] to [3], in Formula (I), $R^1$ and $R^2$ are both H; n is an integer 2 to 40; and m and p are both 0 and q and r are both 1.

[6] In the polishing composition according to any one of [1] to [3], in Formula (I), $R^1$ is a $C_1$ to $C_{18}$ linear alkyl group, a $C_3$ to $C_{18}$ branched alkyl group, or a $C_2$ to $C_{18}$ linear alkenyl group and $R^2$ is H; n is an integer 2 to 20; and m and p are both 0 and q and r are both 1.

[7] In the polishing composition according to any one of [1] to [3], in Formula (I), $R^1$ is a $C_1$ to $C_{18}$ linear alkyl group, a $C_3$ to $C_{18}$ branched alkyl group, or a $C_2$ to $C_{18}$ linear alkenyl group and $R^2$ is H; n is an integer 2 to 20; and m, q, and r are all 1 and p is 0.

[8] In the polishing composition according to any one of [1] to [3], in Formula (I), $R^1$ and $R^2$ are both H; n is an integer 2 to 20; and m, p, and q are all 0 and r is 2.

[9] In the polishing composition according to any one of [1] to [8], a content of the polishing abrasive grains is 0.1% to 10% by weight with respect to a total weight of the polishing composition.

[10] A polishing method includes polishing an object to be polished using the polishing composition according to any one of [1] to [9], in which a material for the object to be polished includes an oxide and a silicon-containing material and the silicon-containing material is represented by $Si_xGe_{1-x}$ where x=0.1 to 1.

[11] In the polishing method according to [10], a removal rate of the polishing composition with respect to the oxide is a first removal rate R1 and a removal rate of the polishing composition with respect to the silicon-containing material is a second removal rate R2 when a polishing pressure is 1.0 psi, and a ratio value R1/R2 of the first removal rate to the second removal rate is 10 or more.

[12] A method for manufacturing a substrate includes preparing a substrate, in which a surface of the substrate contains an oxide and a silicon-containing material and the silicon-containing material is represented by $Si_xGe_{1-x}$ where x=0.1 to 1; and polishing the substrate using the polishing composition according to any one of [1] to [9].

The polishing composition according to the present invention contains polishing abrasive grains satisfying specific conditions and an additive having a specific structure and can realize a high polishing selectivity of an oxide to a silicon-containing material in a specific pH environment. More specifically, in the polishing composition according to the present invention, polishing abrasive grains having a relatively low silanol group density are used, and it is thus possible to increase the polishing speed of an oxide. In addition, in the polishing composition according to the present invention, an additive molecule having a specific structure (that is, having a structure represented by Formula (I) to be described later) is used, and it is thus possible to decrease the polishing speed of a silicon-containing material (for example, silicon-germanium or silicon). Furthermore, the polishing composition according to the present invention is used in a specific acidic pH (namely, a pH of 1.5 or more and 4.5 or less) environment, and it is thus possible to avoid a decrease in the removal rate of an oxide and the polishing selectivity of an oxide to a silicon-containing material. When chemical mechanical polishing is performed on an oxide layer formed on a silicon-containing material layer using the polishing composition according to the present invention, the silicon-containing material layer can be used as a polishing stop layer as it is, and thus it is not necessary to form a further polishing stop layer (for example, a silicon nitride layer). It is thus possible to simplify the complexity of process and to decrease the time and cost required for production. In addition, in the polishing composition according to the present invention, the removal rate of an oxide can be adjusted by adjusting the kind and content of additive. For example, the removal rate of an oxide can be further increased, and the time required for the polishing step is shortened.

DETAILED DESCRIPTION

In order to make the above-mentioned and other purposes, features, and advantages of the present invention clearer and easier to understand, preferred embodiments will be given below and described in detail.

Hereinafter, embodiments of the present invention will be described. The present invention is not limited to these embodiments.

One embodiment of the present invention provides a polishing composition containing: polishing abrasive grains which contains silica particles and in which a silanol group density on a surface of the silica particles is 0 to 3.0 groups/nm$^2$ and the silanol group density is calculated and determined based on a specific surface area measured by a BET method and an amount of silanol groups measured by titration; an additive molecule; a pH adjusting agent used to adjust a pH of the polishing composition to a range of 1.5 or more and 4.5 or less; and a dispersing medium. The additive molecule has a structure represented by Formula (I).

[Chem. 2]

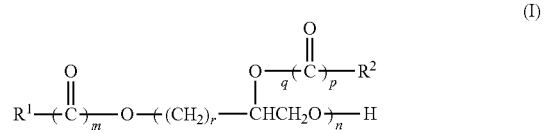

(I)

In Formula (I), $R^1$ and $R^2$ are each independently H, a $C_1$ to $C_{18}$ linear alkyl group, a $C_3$ to $C_{18}$ branched alkyl group, or a $C_2$ to $C_{18}$ linear alkenyl group; n is an integer 2 to 40; and m, p, and q are each independently 0 or 1 and r is an integer 0 to 2, $R^1$ is a $C_1$ to $C_{18}$ linear alkyl group, a $C_3$ to $C_{18}$ branched alkyl group, or a $C_2$ to $C_{18}$ linear alkenyl group when m is 1, and $R^2$ is a $C_1$ to $C_{18}$ linear alkyl group, a $C_3$ to $C_{18}$ branched alkyl group, or a $C_2$ to $C_{18}$ linear alkenyl group when p is 1.

In the present embodiment, in the polishing composition, silica particles having a relatively low silanol group density are used as polishing abrasive grains, an additive having a specific structure is combined, and a high polishing selectivity of an oxide to silicon-germanium or silicon (that is, the polishing selectivity of oxide/silicon-containing material is high) can be realized in a particular pH environment. When chemical mechanical polishing is performed on an object to be polished containing a silicon-containing material and an oxide using the polishing composition of the present embodiment, it is possible to increase the removal rate of the oxide as well as to increase the polishing selectivity of the oxide to silicon-germanium or silicon. Hence, the silicon-containing material can be used as a polishing stop layer, and it is not necessary to form a further polishing stop layer. As a result, the surface flatness of the object to be polished is improved, and it is possible to simplify the complexity of process and to decrease the time and cost required for production.

The object to be polished applied to the polishing composition according to the present invention is not particularly limited, and any general semiconductor substrate can be applied. The polishing composition according to the present invention is particularly suitable to polish a substrate containing a silicon-containing material and an oxide on the surface, and the technical effect of the present invention is fully exhibited. Specific examples of the oxide include silicon oxide. Examples of the silicon-containing material include amorphous silicon, monocrystalline silicon, polycrystalline silicon, silicon-germanium, or any combination thereof. Specific examples of the silicon-containing material include a silicon-containing material represented by a molecular formula $Si_xGe_{1-x}$. The value of x in the molecular formula is preferably 0.1 or more, more preferably 0.2 or more, still more preferably 0.3 or more. The value of x in the molecular formula is preferably 1 or less, more preferably 0.9 or less, still more preferably 0.8 or less.

Furthermore, in the present specification, the "substrate containing a silicon-containing material and an oxide" may be any substrate containing a silicon-containing material and an oxide on the surface, and the aspect thereof is not particularly limited. For example, a patterned structure formed of an oxide and a silicon-containing material may be present on the surface of an arbitrary substrate, or an oxide layer may be present on a substrate formed of a silicon-containing material, or a patterned structure formed of an oxide layer and other materials may be present on a substrate (or a silicon-containing material layer) formed of a silicon-containing material. Several different aspects of the "substrate containing a silicon-containing material and an oxide" have been mentioned here, but these are not intended to limit the present invention. The present invention may include other possible aspects of an arbitrary "substrate containing a silicon-containing material and an oxide".

Hereinafter, various kinds of components contained in the polishing composition according to the present embodiment will be described.

[Polishing Abrasive Grain]

The polishing composition of the present embodiment contains silica as polishing abrasive grains. In several embodiments of the present invention, the polishing abrasive grains are colloidal silica. In several embodiments of the present invention, silica particles having a relatively low silanol group density are used as polishing abrasive grains. In the present specification, the term "silanol group density" means the number of silanol groups per unit area of the silica particle surface. The silanol group density is an index for expressing the electrical or chemical properties of the silica particle surface.

In the present specification, the silanol group density is calculated and determined based on the specific surface area measured by the BET method and the amount of silanol groups measured by titration. The average silanol group density (unit: groups/nm$^2$) on the silica (polishing abrasive grain) surface can be calculated, for example, by the Sears titration method using neutralization titration described in "Analytical Chemistry, vol. 28, No. 12, 1956, 1982-1983" by G. W. Sears. The "Sears titration method" is an analytical method commonly used by colloidal silica manufacturers to evaluate silanol group densities and is a method in which calculation is performed based on the amount of aqueous sodium hydroxide solution required to change the pH from 4 to 9. The details of silanol group density measurement will be described in detail in the following Examples.

The silanol group density of the polishing abrasive grains is 0 to 3.0 groupls/nm$^2$. When the silanol group density is within the above range, the silica particles can favorably adsorb the additive molecules in the present embodiment. As a result, the additive molecules can be adsorbed and concentrated on the surface of the polishing abrasive grains, and the aggregation of the polishing abrasive grains can be avoided by the steric hindrance of the additive molecules. Hence, the dispersion stability of the polishing abrasive grains in the polishing composition is improved, the polishing abrasive grains are less likely to aggregate, and the storage stability is also improved. On the other hand, by adsorbing and concentrating the additive molecules on the surface of the polishing abrasive grains, the polishing selectivity of the oxide to silicon-germanium or silicon can be improved. The silanol group density of the polishing abrasive grains is preferably more than 0 group/nm$^2$, more preferably 0.5 group/nm$^2$ or more, still more preferably 1.0 group/nm$^2$ or more, yet still more preferably 1.2 groups/nm$^2$ or more. In addition, the silanol group density of the polishing abrasive grains is preferably 2.5 groups/nm$^2$ or less, more preferably 2.0 groups/nm$^2$ or less, still more preferably 1.8 groups/nm$^2$ or less.

In an embodiment of the present invention, in order to set the number of silanol groups per unit surface area of abrasive grains to 0 to 3.0 groups/nm$^2$, the number of silanol groups can be controlled by selecting the method for manufacturing the abrasive grains, and the like, for example, it is suitable to perform a heat treatment such as firing. In an embodiment of the present invention, firing is performed, for example, by holding abrasive grains (for example, silica) in an environment of 120° C. to 200° C. for 30 minutes or longer. By performing such a heat treatment, the number of silanol groups on the abrasive grain surface can be set to a desired numerical value such as 0 to 3.0 groups/nm$^2$. Unless such a special treatment is performed, the number of silanol groups on the abrasive grain surface does not reach more than 0 group/nm$^2$ and 3.0 groups/nm$^2$ or less.

The average primary particle size of the polishing abrasive grains is preferably 5 nm or more, more preferably 7 nm or more, still more preferably 10 nm or more, particularly preferably 25 nm or more. As the average primary particle size of the polishing abrasive grains increases, the polishing speeds with respect to the silicon-containing material and the oxide may further increase. The average primary particle size of the polishing abrasive grains is preferably 120 nm or less, more preferably 80 nm or less, still more preferably 50 nm or less. As the average primary particle size of the polishing abrasive grains decreases, a polished surface with less scratches can be easily obtained when an object to be polished is polished using the polishing composition. In addition, the value of the average primary particle size of the polishing abrasive grains can be calculated based on the specific surface area measured by the BET method.

The average secondary particle size of the polishing abrasive grains is preferably 10 nm or more, more preferably 20 nm or more, still more preferably 30 nm or more, particularly preferably 50 nm or more. As the average secondary particle size of the polishing abrasive grains increases, the polishing speeds with respect to the silicon-containing material and the oxide may further increase. The average secondary particle size of the polishing abrasive grains is preferably 250 nm or less, more preferably 200 nm or less, still more preferably 150 nm or less, particularly preferably 100 nm or less. As the average secondary particle size of the polishing abrasive grains decreases, a polished surface with less scratches can be easily obtained when an object to be polished is polished using the polishing composition. In addition, the value of the average secondary particle size of the polishing abrasive grains can be measured by, for example, a laser light scattering method.

In several embodiments of the present invention, the zeta potential of the polishing abrasive grains under acidic conditions is a positive value and thus the polishing abrasive grains can be strongly repelled from each other and favorably dispersed. Hence, the storage stability of the polishing composition increases. Furthermore, in several embodiments of the present invention, the surface zeta potential of the polishing abrasive grains is a positive value, there is electrostatic force of attraction between the polishing abrasive grains and a negatively charged object to be polished (for example, an oxide), and thus the polishing speed of the oxide can increase. In several embodiments of the present invention, the zeta potential of the polishing abrasive grains under specific acidic conditions (for example, the pH is 1.5 or more and 4.5 or less) is preferably +10 mV or more, more preferably +20 mV or more, still more preferably +30 mV or more. In addition, the zeta potential of the polishing abrasive grains under specific acidic conditions (for example, the pH is 1.5 or more and 4.5 or less) is preferably +100 mV or less, more preferably +80 mV or less, still more preferably +60 mV or less, particularly preferably +40 mV or less.

In several embodiments of the present invention, the content of the polishing abrasive grains is preferably 0.01% by weight or more, more preferably 0.05% by weight or more, still more preferably 0.1% by weight or more, particularly preferably 0.3% by weight or more with respect to the total weight of the polishing composition. In addition, the content of the polishing abrasive grains is preferably 10.0% by weight or less, more preferably 5.0% by weight or less, still more preferably 2.0% by weight or less, particularly preferably 1.0% by weight or less. As the content of polishing abrasive grains increases, the polishing speed with respect to the object to be polished increases. On the other hand, as the content of the polishing abrasive grains decreases, the material cost of the polishing composition can decrease and the aggregation of the polishing abrasive grains may be less likely to occur. Furthermore, by decreasing the content of the polishing abrasive grains, it is possible to prevent the surface of the object to be polished after polishing from being uneven by excessive polishing.

[Additive Molecule]

The polishing composition of the present embodiment contains at least one additive molecule, and the additive molecule has a structure represented by Formula (I):

[Chem. 3]

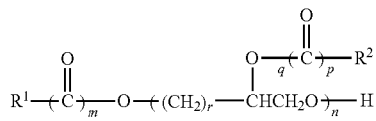

(I)

In Formula (I), $R^1$ and $R^2$ are each independently H, a $C_1$ to $C_{18}$ linear alkyl group, a $C_3$ to $C_{18}$ branched alkyl group, or a $C_2$ to $C_{18}$ linear alkenyl group; n is an integer 2 to 40; and m, p, and q are each independently 0 or 1 and r is an integer 0 to 2, $R^1$ is a $C_1$ to $C_{18}$ linear alkyl group, a $C_3$ to $C_{18}$ branched alkyl group, or a $C_2$ to $C_{18}$ linear alkenyl group when m is 1, and $R^2$ is a $C_1$ to $C_{18}$ linear alkyl group, a $C_3$ to $C_{18}$ branched alkyl group, or a $C_2$ to $C_{18}$ linear alkenyl group when p is 1. In addition, in an embodiment, $R^1$ is a $C_1$ to $C_{18}$ linear alkyl group, a $C_3$ to $C_{18}$ branched alkyl group, or a $C_2$ to $C_{18}$ linear alkenyl group when m is 1, and $R^2$ is a C1 to $C_{18}$ linear alkyl group, a $C_3$ to $C_{18}$ branched alkyl group, or a $C_2$ to $C_{18}$ linear alkenyl group when p is 1.

Here, in the present specification, the $C_1$ to $C_{18}$ linear alkyl group (namely, a linear alkyl group having 1 to 18 carbon atoms) or the $C_3$ to $C_{18}$ branched alkyl group (namely, a branched alkyl group having 3 to 18 carbon atoms) is not particularly limited, and examples thereof include a n-propyl group, an isopropyl group, a n-butyl group, an isobutyl group, a sec-butyl group, a tert-butyl group, a n-pentyl group, an isopentyl group, a 2-methylbutyl group, a sec-pentyl group, a neopentyl group, a 1,2-dimethylpropyl group, a tert-pentyl group, a hexyl group, an isohexyl group, a heptyl group, an octyl group, a nonyl group, a decyl group, an undecyl group, a dodecyl group (lauryl group), a 2-ethylhexyl group, a tridecyl group, a tetradecyl group, a pentadecyl group, a hexadecyl group, a heptadecyl group, an octadecyl group, and the like.

In the present specification, the $C_2$ to $C_{18}$ linear alkenyl group (a linear alkenyl group having 2 to 20 carbon atoms) is not particularly limited, and examples thereof include an ethenyl group, a propenyl group, an allyl group, an isopropenyl group, a 1-hexenyl group, a 2-hexenyl group, a 3-hexenyl group, a 1-heptenyl group, a 2-heptenyl group, a 3-heptenyl group, a 9-decenyl group, a 11-dodecenyl group, a (Z)-9-pentadecenyl group, an oleyl group (Z-9-octadecenyl group), and the like.

As described above, the silanol group density on the surface of the silica polishing abrasive grains is relatively low, and thus the hydrophobicity of the polishing abrasive grains increases. In addition, the surface of the silicon-containing material (for example, silicon-germanium or silicon) that is the object to be polished is also a surface having relatively high hydrophobicity. In a case in which the above-described additive is not used, the affinity between the hydrophobic polishing abrasive grains and the hydrophobic silicon-containing material is relatively great, and thus the polishing speed of the polishing abrasive grains with respect to the silicon-containing material is high. In such a case, the polishing speed ratio of the oxide to the silicon-containing material is excessively low, and thus the silicon-containing material cannot be used as a polishing stop layer when the oxide is polished.

Please refer to the structure represented by Formula (I). The additive molecule has a hydrophobic molecular chain segment, for example, $R^1$, $R^2$, or an alkyl chain segment on the main chain. The additive molecule is adsorbed and concentrated on the hydrophobic surfaces of the polishing abrasive grains and the silicon-containing material through the hydrophobic molecular chain segment. Hence, one thin layer formed of the additive molecules is adsorbed on the surfaces of the polishing abrasive grains and the silicon-containing material. Direct contact between the polishing abrasive grains and the silicon-containing material may be decreased or avoided by causing hindrance due to the steric structure of the additive molecules. In other words, the additive molecule can form a protective layer-like structure on the surface of the silicon-containing material and can significantly decrease the polishing speed of the silicon-containing material. As a result, the polishing speed ratio of the oxide to the silicon-containing material increases, and thus the silicon-containing material can be used as a polishing stop layer at the time of oxide polishing.

In addition, please refer to the structure represented by Formula (I). The additive molecule has a hydrophilic group at the end position, for example, a hydroxyl (—OH) group. Accordingly, after the additive molecules are adsorbed on the surface of the polishing abrasive grains, the hydrophilic groups on the surface of the polishing abrasive grains increase, and the hydrophilicity of the polishing abrasive grains also increases in association with this. Furthermore, the surface of the oxide of the object to be polished is also a surface having relatively high hydrophilicity. One thin layer formed of the additive molecules is adsorbed on the surface of the polishing abrasive grains, but there is electrostatic force of attraction between the polishing abrasive grains and the oxide as well as the affinity between the hydrophilic polishing abrasive grains and the hydrophilic oxide is sufficiently high, and it is thus still possible to moderately increase the polishing speed of the oxide. As a result, the polishing speed ratio of the oxide to the silicon-containing material further increases, and this is thus more advantageous in order to use the silicon-containing material as a polishing stop layer when the oxide is polished. In addition, an increase in polishing speed of the oxide also leads to shortening of the time required for the polishing step, and this contributes to the improvement in production efficiency.

In several embodiments of the present invention, in the structure represented by Formula (I), $R^1$ is H and $R^2$ is a $C_1$ to $C_{18}$ linear alkyl group, a $C_3$ to $C_{18}$ branched alkyl groups, or a $C_2$ to $C_{18}$ linear alkenyl group; n is an integer 2 to 20; and m, p, q, and r are all 0. In such an embodiment, the molecular structure of the additive molecule is relatively simple and is likely to be closely arranged. For this reason, the additive molecules are likely to form a thin layer having a relatively dense structure on the surfaces of the polishing abrasive grains and the silicon-containing material, and as a result, it is possible to properly protect the silicon-containing material. Hence, the polishing speed of the silicon-containing material can be significantly decreased. Furthermore, in such an embodiment, the additive molecule has a large number of hydrophilic groups, and thus the hydrophilicity of the surface of the polishing abrasive grains may increase. Accordingly, the affinity between the polishing abrasive grains and the hydrophilic oxide increases, and eventually the polishing speed of the oxide further increases. As a result, the polishing speed ratio of the oxide to the silicon-containing material further increases, and this is thus more advantageous in order to use the silicon-containing material as a polishing stop layer when the oxide is polished, and this also leads to shortening of the time required for the polishing step.

In the present embodiment, $R^2$ is preferably a $C_1$ to $C_{18}$ linear alkyl group, more preferably a $C_1$ to $C_{10}$ linear alkyl group, still more preferably a $C_1$ to $C_5$ linear alkyl group, yet still more preferably a $C_1$ to $C_3$ linear alkyl group.

In several embodiments of the present invention, in the structure represented by Formula (I), $R^1$ and $R^2$ are both H; n is an integer 2 to 40; and m and p are both 0 and q and r are both 1. In such an embodiment, the molecular structure of the additive molecule is relatively simple and is likely to be closely arranged. For this reason, the additive molecules are likely to form a thin layer having a relatively dense structure on the surfaces of the polishing abrasive grains and the silicon-containing material, and as a result, it is possible to properly protect the silicon-containing material. Hence, the polishing speed of the silicon-containing material can be significantly decreased. Furthermore, in such an embodiment, the additive molecule has a large number of hydrophilic groups, and thus the hydrophilicity of the surface of the polishing abrasive grains may increase. Accordingly, the affinity between the polishing abrasive grains and the hydrophilic oxide increases, and eventually the polishing speed of the oxide further increases. As a result, the polishing speed ratio of the oxide to the silicon-containing material further increases, and this is thus more advantageous in order to use the silicon-containing material as a polishing stop layer when the oxide is polished, and this also leads to shortening of the time required for the polishing step.

In several embodiments of the present invention, in the structure represented by Formula (I), $R^1$ and $R^2$ are both H; and m, p, and q are all 0 and r is 2. In such an embodiment, the molecular structure of the additive molecule is relatively simple and is likely to be closely arranged. For this reason, the additive molecules are likely to form a thin layer having a relatively dense structure on the surfaces of the polishing abrasive grains and the silicon-containing material, and as a result, it is possible to properly protect the silicon-containing material. Hence, the polishing speed of the silicon-containing material can be significantly decreased. Furthermore, in such an embodiment, the additive molecule has a large number of hydrophilic groups, and thus the hydrophilicity of the surface of the polishing abrasive grains may increase. Accordingly, the affinity between the polishing abrasive grains and the hydrophilic oxide increases, and eventually the polishing speed of the oxide further increases. As a result, the polishing speed ratio of the oxide to the silicon-containing material further increases, and this is thus more advantageous in order to use the silicon-containing material as a polishing stop layer when the oxide is polished, and this also leads to shortening of the time required for the polishing step.

In several embodiments of the present invention, in the structure represented by Formula (I), $R^1$ is a $C_1$ to $C_{18}$ linear alkyl group, a $C_3$ to $C_{18}$ branched alkyl groups, or a $C_2$ to $C_{18}$ linear alkenyl group and $R^2$ is H; n is an integer 2 to 20; and m and p are both 0 and q and r are both 1. In such an embodiment, the additive molecule has a hydrophobic molecular chain segment (namely, an alkyl chain segment positioned at the end). Accordingly, the additive molecules may be more easily adsorbed on the hydrophobic surfaces of the polishing abrasive grains and the silicon-containing material. Furthermore, the hydrophobic molecular chain segment can change the steric structure of the additive molecule to a larger one, and this is thus advantageous in order to further decrease or avoid direct contact between the polishing abrasive grains and the silicon-containing material. As a result, the polishing speed of the silicon-containing material further decreases, the polishing speed ratio of the oxide to the silicon-containing material further increases, and this is thus more advantageous in order to use the silicon-containing material as a polishing stop layer when the oxide is polished.

In the present embodiment, $R^1$ is preferably a $C_3$ to $C_{18}$ linear alkyl group or a $C_2$ to $C_{18}$ linear alkenyl group, more preferably a $C_5$ to $C_{18}$ linear alkyl group or a $C_5$ to $C_{18}$ linear alkenyl group, still more preferably a $C_{10}$ to $C_{18}$ linear alkyl group or a $C_{10}$ to $C_{18}$ linear alkenyl group, yet still more preferably a $C_{10}$ to $C_{16}$ linear alkyl group or a $C_{12}$ to $C_{18}$ linear alkenyl group, particularly preferably a $C_{10}$ to $C_{14}$ linear alkyl group.

In several embodiments of the present invention, in the structure represented by Formula (I), $R^1$ is H and $R^2$ is a $C_1$ to $C_{18}$ linear alkyl group, a $C_3$ to $C_{18}$ branched alkyl groups, or a $C_2$ to $C_{18}$ linear alkenyl group; n is an integer 2 to 20; and m and p are both 0 and q and r are both 1. In such an embodiment, the additive molecule has a large number of hydrophobic molecular chain segments (namely, alkyl chain segments positioned in the side chains). Accordingly, the additive molecules may be more easily adsorbed on the hydrophobic surfaces of the polishing abrasive grains and the silicon-containing material. Furthermore, the large number of hydrophobic molecular chain segments can change the steric structure of the additive molecule to a larger one, and this is thus advantageous in order to further decrease or avoid direct contact between the polishing abrasive grains and the silicon-containing material. As a result, the polishing speed of the silicon-containing material further decreases, the polishing speed ratio of the oxide to the silicon-containing material further increases, and this is thus more advantageous in order to use the silicon-containing material as a polishing stop layer when the oxide is polished.

In the present embodiment, $R^2$ is preferably a $C_3$ to $C_{18}$ linear alkyl group or a $C_2$ to $C_{18}$ linear alkenyl group, more preferably a $C_5$ to $C_{18}$ linear alkyl group or a $C_5$ to $C_{18}$ linear alkenyl group, still more preferably a $C_{10}$ to $C_{18}$ linear alkyl group or a $C_{10}$ to $C_{18}$ linear alkenyl group, yet still more preferably a $C_{10}$ to $C_{16}$ linear alkyl group or a $C_{12}$ to $C_{18}$ linear alkenyl group, particularly preferably a $C_{10}$ to $C_{14}$ linear alkyl group.

In several embodiments of the present invention, in the structure represented by Formula (I), $R^1$ is a $C_1$ to $C_{18}$ linear alkyl group, a $C_3$ to $C_{18}$ branched alkyl groups, or a $C_2$ to $C_{18}$ linear alkenyl group and $R^2$ is H; n is an integer 2 to 20; and m, q, and r are all 1 and p is 0. In such an embodiment, the additive molecule has a hydrophobic molecular chain segment (namely, an alkyl chain segment positioned at the end). Accordingly, the additive molecules may be more easily adsorbed on the hydrophobic surfaces of the polishing abrasive grains and the silicon-containing material. Furthermore, the hydrophobic molecular chain segment can change the steric structure of the additive molecule to a larger one, and this is thus advantageous in order to further decrease or avoid direct contact between the polishing abrasive grains and the silicon-containing material. As a result, the polishing speed of the silicon-containing material further decreases, the polishing speed ratio of the oxide to the silicon-containing material further increases, and this is thus more advantageous in order to use the silicon-containing material as a polishing stop layer when the oxide is polished.

In the present embodiment, $R^1$ is preferably a $C_3$ to $C_{18}$ linear alkyl group or a $C_2$ to $C_{18}$ linear alkenyl group, more preferably a $C_5$ to $C_{18}$ linear alkyl group or a $C_5$ to $C_{18}$ linear alkenyl group, still more preferably a $C_{10}$ to $C_{18}$ linear alkyl group or a $C_{10}$ to $C_{18}$ linear alkenyl group, yet still more preferably a $C_{10}$ to $C_{16}$ linear alkyl group or a $C_{12}$ to $C_{18}$ linear alkenyl group, particularly preferably a $C_{10}$ to $C_{14}$ linear alkyl group.

In several embodiments of the present invention, in the structure represented by Formula (I), $R^1$ is H and $R^2$ is a $C_1$ to $C_{18}$ linear alkyl group, a $C_3$ to $C_{18}$ branched alkyl groups, or a $C_2$ to $C_{18}$ linear alkenyl group; n is an integer 2 to 20; and m is 0 and p, q, and r are all 1. In such an embodiment, the additive molecule has a large number of hydrophobic molecular chain segments (namely, alkyl chain segments positioned in the side chains). Accordingly, the additive molecules may be more easily adsorbed on the hydrophobic surfaces of the polishing abrasive grains and the silicon-containing material. Furthermore, the large number of hydrophobic molecular chain segments can change the steric structure of the additive molecule to a larger one, and this is thus advantageous in order to further decrease or avoid direct contact between the polishing abrasive grains and the silicon-containing material. As a result, the polishing speed of the silicon-containing material further decreases, the polishing speed ratio of the oxide to the silicon-containing material further increases, and this is thus more advantageous in order to use the silicon-containing material as a polishing stop layer when the oxide is polished.

In the present embodiment, $R^2$ is preferably a $C_3$ to $C_{18}$ linear alkyl group or a $C_2$ to $C_{18}$ linear alkenyl group, more preferably a $C_5$ to $C_{18}$ linear alkyl group or a $C_5$ to $C_{18}$ linear alkenyl group, still more preferably a $C_{10}$ to $C_{18}$ linear alkyl group or a $C_{10}$ to $C_{18}$ linear alkenyl group, yet still more preferably a $C_{10}$ to $C_{16}$ linear alkyl group or a $C_{12}$ to $C_{18}$ linear alkenyl group, particularly preferably a $C_{10}$ to $C_{14}$ linear alkyl group.

In several embodiments of the present invention, the weight average molecular weight (MW) of the additive molecule is preferably 100 or more, more preferably 200 or more, still more preferably 300 or more. The weight average molecular weight (MW) of the additive molecule is preferably 10000 or less, more preferably 6000 or less, still more preferably 4000 or less. The weight average molecular weight in the present specification is measured by gel permeation chromatography (GPC) using polystyrene as a standard substance.

In several embodiments of the present invention, the weight average molecular weight (MW) of the additive molecule is 100 or more, 200 or more, 250 or more, 300 or more, 450 or more, 400 or more, 500 or more, or 600 or more. In addition, in several embodiments of the present invention, the weight average molecular weight (MW) of the additive molecule is 1500 or less, 1000 or less, 950 or less, 900 or less, 800 or less, 700 or less, 650 or less, or 600 or less.

In several embodiments of the present invention, in a case in which $R^1$ is H and $R^2$ is a $C_1$ to $C_{18}$ linear alkyl group, a $C_3$ to $C_{18}$ branched alkyl groups, or a $C_2$ to $C_{18}$ linear alkenyl group; n is an integer 2 to 20; and m, p, q, and r are all 0 in Formula (I), the weight average molecular weight (MW) of the additive molecule is 100 or more, 200 or more, 250 or more, 300 or more, or 400 or more. In addition, in several embodiments of the present invention, in a case in which $R^1$ is H and $R^2$ is a $C_1$ to $C_{18}$ linear alkyl group, a $C_3$ to $C_{18}$ branched alkyl groups, or a $C_2$ to $C_{18}$ linear alkenyl group; n is an integer 2 to 20; and m, p, q, and r are all 0 in Formula (I), the weight average molecular weight (MW) of the additive molecule is 1000 or less, 950 or less, 900 or less, 800 or less, 700 or less, 600 or less, or 500 or less.

In several embodiments of the present invention, in a case in which $R^1$ and $R^2$ are both H; n is an integer 2 to 40; and m and p are both 0 and q and r are both 1 in Formula (I), the weight average molecular weight (MW) of the additive molecule is 100 or more, 150 or more, 200 or more, 250 or more, 280 or more, 300 or more, 400 or more, 500 or more, 600 or more, or 700 or more. In addition, in several embodiments of the present invention, in a case in which $R^1$ and $R^2$ are both H; n is an integer 2 to 40; and m and p are both 0 and q and r are both 1 in Formula (I), the weight average molecular weight (MW) of the additive molecule is 3000 or less, 1500 or less, 1000 or less, 900 or less, or 800 or less.

In several embodiments of the present invention, in a case in which an alkyl ether is used as the hydrophobic molecular chain segment, that is, in (i) a case in which $R^1$ is H and $R^2$ is a $C_1$ to $C_{18}$ linear alkyl group, a $C_3$ to $C_{18}$ branched alkyl groups, or a $C_2$ to $C_{18}$ linear alkenyl group; n is an integer 2 to 20; and m and p are both 0 and q and r are both 1 in Formula (I) and (ii) a case in which $R^1$ is a $C_1$ to $C_{18}$ linear alkyl group, a $C_3$ to $C_{18}$ branched alkyl groups, or a $C_2$ to $C_{18}$ linear alkenyl group and $R^2$ is H; n is an integer 2 to 20; and m and p are both 0, and q and r are both 1 in Formula (I), the weight average molecular weight (MW) of the additive molecule is 100 or more, 200 or more, 250 or more, 300 or more, 350 or more, or 400 or more. In addition, in several embodiments of the present invention, in a case in which an alkyl ether is used as the hydrophobic molecular chain segment, the weight average molecular weight (MW) of the additive molecule is 1500 or less, 1000 or less, 900 or less, 800 or less, 600 or less, or 500 or less.

In several embodiments of the present invention, in a case in which a fatty acid ester is used as the hydrophobic molecular chain segment, that is, in (i) a case in which $R^1$ is H and $R^2$ is a $C_1$ to $C_{18}$ linear alkyl group, a $C_3$ to $C_{18}$ branched alkyl groups, or a $C_2$ to $C_{18}$ linear alkenyl group; n is an integer 2 to 20; and m is 0 and p, q, and r are all 1 in Formula (I) and (ii) a case in which $R^1$ is a $C_1$ to $C_{18}$ linear alkyl group, a $C_3$ to $C_{18}$ branched alkyl groups, or a $C_2$ to $C_{18}$ linear alkenyl group and $R^2$ is H; n is an integer 2 to 20; and m, q, and r are all 1 and p is 0 in Formula (I), the weight average molecular weight (MW) of the additive molecule is 100 or more, 200 or more, 250 or more, 300 or more, 350 or more, or 400 or more. In addition, in several embodiments of the present invention, in a case in which a fatty acid ester is used as the hydrophobic molecular chain segment, the weight average molecular weight (MW) of the additive molecule is 1500 or less, 1000 or less, 900 or less, 800 or less, 700 or less, or 600 or less.

In several embodiments of the present invention, in a case in which $R^1$ and $R^2$ are both H; n is an integer 2 to 20; and m, p, and q are all 0 and r is 2 in Formula (I), the weight average molecular weight (MW) of the additive molecule is 100 or more, 150 or more, 200 or more, 220 or more, or 230 or more. In addition, in several embodiments of the present invention, in a case in which $R^1$ and $R^2$ are both H; n is an integer 2 to 20; and m, p, and q are all 0 and r is 2 in Formula (I), the weight average molecular weight (MW) of the additive molecule is 1000 or less, 800 or less, 600 or less, 500 or less, or 400 or less.

When the weight average molecular weight of the additive molecule is excessively large, there is a possibility that the steric structure of the additive molecule is too large. In such a case, gaps are likely to be formed between the additive molecules adsorbed on the polishing abrasive grains and silicon-containing material, and as a result, it is difficult to form a thin layer having a dense structure on the surfaces of the polishing abrasive grains and the silicon-containing material. As a result, the additive molecule cannot properly protect the silicon-containing material, and the polishing speed of the silicon-containing material cannot be sufficiently decreased. Hence, the polishing speed ratio of the oxide to the silicon-containing material cannot be increased, and this is disadvantageous in order to use the silicon-containing material as a polishing stop layer when the oxide is polished.

On the other hand, when the weight average molecular weight of the additive molecule is excessively small, there is a possibility that the number of hydrophobic chain segments of the additive molecule is too small and the hydrophilicity of the additive molecule is too high. In such a case, the additive molecules may be less likely to be adsorbed on the surfaces of the polishing abrasive grains and the silicon-containing material. Accordingly, the additive molecule cannot properly protect the silicon-containing material, and the polishing speed of the silicon-containing material cannot be sufficiently decreased. Furthermore, when the hydrophilicity of the additive molecule is too high, there is a possibility that one thin layer formed of additive molecules is adsorbed on the hydrophilic oxide surface, and thus the polishing speed of the oxide may decrease. Hence, the polishing speed ratio of the oxide to the silicon-containing material decreases, and this is disadvantageous in order to use the silicon-containing material as a polishing stop layer when the oxide is polished.

Incidentally, as the weight average molecular weight of the additive molecules, a value measured by the GPC method (water-based, in terms of polyethylene oxide) can be adopted. The weight average molecular weight can be determined in terms of polyethylene glycol by gel permeation chromatography (GPC) using a GPC instrument (model: Prominence+ELSD detector (ELSD-LTII) manufactured by Shimadzu Corporation) and the like.

As the additive molecule, a commercially available product may be used or a synthetic product may be used. The manufacturing method in the case of synthesizing the additive molecule is not particularly limited, and a known manufacturing method can be used.

In several embodiments of the present invention, the content of the additive molecule is preferably 10 ppm by weight or more, more preferably 30 ppm by weight or more, still more preferably 50 ppm by weight or more, particularly preferably 70 ppm by weight or more with respect to the total weight of the polishing composition. In addition, the content of the additive molecule is preferably 10,000 ppm by weight or less, more preferably 5000 ppm by weight or less, preferably 2000 ppm by weight or less, particularly preferably 1000 ppm by weight or less.

In several embodiments of the present invention, the content of the additive molecule is 60 ppm by weight or more, 80 ppm by weight or more, 90 ppm by weight or more, 95 ppm by weight or more, 120 ppm by weight or more, 150 ppm by weight or more, or 200 ppm by weight or more with respect to the total weight of the polishing composition. In addition, in several embodiments of the present invention, the content of the additive molecule is 900 ppm by weight or less, 700 ppm by weight or less, 500 ppm by weight or less, 400 ppm by weight or less, 350 ppm by weight or less, or 300 ppm by weight or less with respect to the total weight of the polishing composition.

When the content of the additive molecule in the polishing composition is excessively high, there is a possibility that an excessively large number of additive molecules is adsorbed on the surfaces of the polishing abrasive grains and the silicon-containing material. In addition, when the content of the additive molecule is excessively high, there is a possibility that the additive molecules form one thin layer on the surface of the oxide as well. As a result, both the polishing speed of the silicon-containing material and the polishing speed of the oxide decrease, and the polishing speed ratio of the oxide to the silicon-containing material cannot be sufficiently increased, thus this is disadvantageous in order to use the silicon-containing material as a polishing stop layer when the oxide is polished, and this is also disadvantageous in order to shorten the time required for the polishing step.

On the other hand, when the content of the additive molecule in the polishing composition is excessively small, it is difficult for the additive molecules to form one thin layer on the surfaces of the polishing abrasive grains and the silicon-containing material, particularly it is difficult for the additive molecules to cover the entire surfaces of the polishing abrasive grains and the silicon-containing material. Accordingly, the additive molecule cannot properly protect the silicon-containing material, and the polishing speed of the silicon-containing material cannot be sufficiently decreased. In addition, when the content of the additive molecule is too small, the hydrophilicity of the polishing abrasive grains is insufficient, it is difficult to effectively increase the affinity between the polishing abrasive grains and the hydrophilic oxide, and thus the polishing speed of the oxide cannot be increased. As described above, when the content of the additive molecule is too small, it is difficult to increase the polishing speed ratio of the oxide to the silicon-containing material. Hence, this is disadvantageous in order to use the silicon-containing material as a polishing stop layer when the oxide is polished.

[pH Adjusting Agent]

The polishing composition of the present embodiment contains a pH adjusting agent. The pH value of the polishing composition can be adjusted to a range of 1.5 or more and 4.5 or less with a pH adjusting agent. As the pH adjusting agent, a known acid or base can be used.

The acid of a pH adjusting agent used in the polishing composition of the present embodiment may be an inorganic acid or an organic acid or may be a chelating agent. Specific examples of the inorganic acid that can be used as a pH adjusting agent include, for example, hydrochloric acid (HCl), sulfuric acid ($H_2SO_4$), nitric acid ($HNO_3$), hydrofluoric acid (HF), boric acid ($H_3BO_3$), carbonic acid ($H_2CO_3$), hypophosphorous acid ($H_3PO_2$), phosphorous acid ($H_3PO_3$), and phosphoric acid ($H_3PO_4$). Among these inorganic acids, preferred ones are hydrochloric acid, sulfuric acid, nitric acid, and phosphoric acid.

Specific examples of the organic acid that can be used as a pH adjusting agent include, for example, formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, hydroxyacetic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, glyoxylic acid, 2-furancarboxylic acid, 2,5-furandicarboxylic acid, 3-furancarboxylic acid, 2-tetrahydrofuran carboxylic acid, methoxyacetic acid, methoxyphenylacetic acid, and phenoxyacetic acid. Organic sulfuric acids such as methanesulfonic acid, ethanesulfonic acid, and 2-hydroxyethanesulfonic acid (isethionic acid) may be used. Among these organic acids, preferred ones are oxalic acid, malonic acid, succinic acid, glutaric acid, adipic acid, pimelic acid, maleic acid, phthalic acid, malic acid, tartaric acid, 2,5-furandicarboxylic acid, and citric acid.

Examples of the base of a pH adjusting agent used in the polishing composition of the present embodiment include hydroxides of alkali metals or salts thereof, hydroxides of group 2 elements or salts thereof, and quaternary ammonium hydroxides or salts thereof, ammonia, and amines. Specific examples of the alkali metals include potassium, sodium, and the like.

As the pH of the polishing composition increases, the zeta potential on the surface of the polishing abrasive grains shifts to a negative value and the zeta potentials on the surfaces of the oxide and the silicon-containing material also shift to a negative value. Accordingly, when the pH of the polishing composition is excessively high (for example, the pH is 5 or more), there is a possibility that the zeta potential on the surface of the polishing abrasive grains is a negative value and there is a possibility that the zeta potential on the surface of the object to be polished is also a negative value. Accordingly, as the electrostatic force of repulsion between the polishing abrasive grains and the object to be polished (including the oxide and the silicon-containing material) increases, both the polishing speeds of the silicon-containing material and the oxide significantly decrease and it is difficult to increase the polishing speed ratio of the oxide to the silicon-containing material. Hence, this is disadvantageous in order to use the silicon-containing material as a polishing stop layer when the oxide is polished, and this is also disadvantageous in order to shorten the time required for the polishing step.

The pH of the polishing composition of the present embodiment is in a range of 1.5 or more and 4.5 or less. In such an environment, the surface zeta potential of the polishing abrasive grains is a positive value, and there is electrostatic force of attraction between the polishing abrasive grains and a negatively charged object to be polished (for example, an oxide). Accordingly, the polishing speed of the oxide may increase. Furthermore, under acidic conditions, silica particles as polishing abrasive grains are less likely to cause aggregation by electrostatic repulsion, and the storage stability of the polishing composition may significantly increase. More specifically, the pH of the polishing composition of the present embodiment is preferably 1.8 or more, more preferably 2 or more, still more preferably 2.5 or more. In addition, the pH of the polishing composition of the present embodiment is preferably 4.2 or less, more preferably 4 or less, still more preferably 3.5 or less.

In several embodiments, the polishing composition may have a pH of 1.5 or more, 1.6 or more, 1.7 or more, 1.8 or more, 1.9 or more, 2.0 or more, 2.1 or more, 2.2 or more, 2.3 or more, 2.4 or more, 2.5 or more, 2.6 or more, or 2.7 or more. In addition, in several embodiments, the polishing composition may have a pH of 4.5 or less, 4.4 or less, 4.3 or less, 4.2 or less, 4.1 or less, 4.0 or less, 3.9 or less, 3.8 or less, 3.7 or less, 3.6 or less, or 3.5 or less.

When the pH of the polishing composition is excessively high, the polishing speed of the oxide significantly decreases and the polishing speed ratio of the oxide to the silicon-containing material also significantly decreases. Hence, this is disadvantageous in order to use the silicon-containing material as a polishing stop layer when the oxide is polished, and this is also disadvantageous in order to shorten the time required for the polishing step. Furthermore, when the pH value of the polishing composition is excessively high, the storage stability of the polishing composition may also decrease. On the other hand, when the pH value of the polishing composition is excessively low, the safety of process decreases and the burden of waste water treatment increases.

[Dispersing Medium]

The polishing composition of the present embodiment contains a dispersing medium (may be referred to as "solvent"). The dispersing medium can be used to disperse or dissolve the respective components in the polishing composition. In the present embodiment, the polishing composition may contain water as a dispersing medium. Water containing as little impurities as possible is preferable from the viewpoint of preventing the action of other components from being inhibited. More specifically, pure water or ultrapure water from which impurity ions have been removed using an ion exchange resin and then foreign matters have been removed by allowing the water to pass through a filter, or distilled water is preferable.

[Other Components]

The polishing composition used in the polishing method of the present invention may further contain other components such as a chelating agent, an oxidizing agent, a metal anticorrosive, an antiseptic agent, and an antifungal agent, if necessary.

<Polishing Method and Method for Manufacturing Substrate>

As described above, the polishing composition according to the present invention is particularly suitable to polish a substrate containing a silicon-containing material and an oxide. Accordingly, the present invention provides a polishing method in which an object to be polished containing a silicon-containing material and an oxide is polished using the polishing composition according to the present invention. For example, such an object to be polished may include a substrate formed of a silicon-containing material and an oxide layer formed on this substrate. Specific examples of the oxide include silicon oxide. Specific examples of the silicon-containing material include a silicon-containing material represented by a molecular formula $Si_xGe_{1-x}$ where x=0.1 to 1. In addition, the present invention also provides a method for manufacturing a substrate, which includes a step of performing polishing on a substrate containing a silicon-containing material and an oxide-germanium material using the polishing composition according to the present invention.

When an object to be polished containing a silicon-containing material and an oxide is polished, it is more preferable as the difference between the removal rate of the oxide and the removal rate of the silicon-containing material is greater in order to use the silicon-containing material as a polishing stop layer at the time of oxide polishing. In other words, it is more preferable as the polishing selectivity (polishing speed ratio or removal rate ratio) of the oxide to the silicon-containing material is higher. More specifically, when an object to be polished containing a silicon-containing material and an oxide is polished at a specific polishing pressure (for example, 1.0 psi), the ratio value (R1/R2) of the removal rate R1 of the oxide to the removal rate R2 of the silicon-containing material is 10 or more, and it is more preferable as the ratio value R1/R2 is higher. In several embodiments of the present invention, the removal rate of the polishing composition with respect to the oxide is the first removal rate R1 and the removal rate of the polishing composition with respect to the silicon-containing material is the second removal rate R2 when the polishing pressure is 1.0 psi, and the ratio value R1/R2 of the first removal rate to the second removal rate is preferably 10 or more, more preferably 15 or more, still more preferably 20 or more, particularly preferably 30 or more. The upper limit value of the ratio value (R1/R2) of the first removal rate to the second removal rate is not particularly limited, and it is more preferable as the ratio value is higher, but the ratio value (R1/R2) can be set to 200 or less as an example.

As the polishing apparatus used in the polishing step, a polishing apparatus used in a general chemical mechanical polishing process can be used. Such a polishing apparatus is equipped with a polishing table to which a polishing pad (or polishing cloth) can be attached as well as is equipped with a carrier that holds the object to be polished, a motor that can change the number of rotations, and the like.

The polishing pad is not particularly limited, and general non-woven fabrics, polyurethane resin pads, porous fluororesin pads, and the like can be used. Furthermore, the polishing pad can also be grooved so that the polishing composition accumulates in the groove of the polishing pad if necessary.

The parameter conditions of the polishing step are also not particularly limited and can be adjusted as actually required. For example, the rotational speed of the polishing table can be set to 10 to 500 rpm, and the rotational speed of the carrier can be set to 10 to 500 rpm, the flow rate of the polishing composition can be set to 10 to 500 mL/min, the polishing pressure can be set to 0.1 to 10 psi, and the polishing time can be set to 10 seconds to 30 minutes. The method for supplying the polishing composition to the polishing pad is also not particularly limited, and, for example, a method by continuous supply using a pump and the like can be adopted.

After the polishing step is finished, the object to be polished is washed in a stream of water and dried by blowing off the water droplets attached to the object to be polished using a rotary dryer or the like to obtain a substrate having a flat surface and no level difference.

EXAMPLES

The present invention will be described in more detail with reference to the following Examples and Comparative Examples, but the technical scope of the present invention is not limited only to the following Examples. In addition, in the present specification, operations and measurements of physical properties and the like are performed under the conditions of room temperature (20° C. to 25° C.)/relative humidity of 40% to 50% RH unless otherwise stated.

[Preparation of Polishing Composition]

A polishing composition was prepared by mixing (mixing temperature: about 25° C., mixing time: about 10 minutes) polishing abrasive grains, an additive, and a pH adjusting agent in a dispersing medium (ultrapure water) according to the composition presented in the following Table 1. The pH of the polishing composition was confirmed using a pH meter (LAQUA manufactured by HORIBA, Ltd.) (the temperature of the polishing composition at the time of pH measurement: 25° C.). In addition, "-" in Table 1 indicates that the component is not added. Details of the respective components in Table 1 and Table 2 are as follows.

[Polishing Abrasive Grains and Additive Molecules]

Polishing abrasive grains a: Colloidal silica (primary particle size: 30 nm, secondary particle size: 60 nm, silanol group density on surface of polishing abrasive grains: 1.5 groups/nm$^2$)

Polishing abrasive grain b: Colloidal silica (primary particle size: 35 nm, secondary particle size: 70 nm, silanol group density on surface of polishing abrasive grains: 4.4 groups/nm$^2$)

Polishing abrasive grain c: Colloidal silica (primary particle size: 35 nm, secondary particle size: 70 nm, silanol group density on surface of polishing abrasive grains: 4.5 groups/nm$^2$)

Additive A: Glycerol (MW: 92 g/mol)
Additive B: Polypropylene glycol 400 (MW: 446 g/mol)
Additive C: Polyglycerin #310 (MW: 314 g/mol)
Additive D: Polyglycerin #500 (MW: 462 g/mol)
Additive E: Polyglycerin #750 (MW: 759 g/mol)
Additive F: Polyglycerin 40 (MW: 2978 g/mol)
Additive G: Polyglyceryl-4 lauryl ether (MW: 482 g/mol)
Additive H: Polyglyceryl-10 lauric acid ester (MW: 940 g/mol)
Additive I: Polyglyceryl-10 oleic acid ester (MW: 1022 g/mol) HNO$_3$: Nitric acid (concentration: 70%)

Additive J: Polyglyceryl-4 lauric acid ester (MW: 432 g/mol)

Additive K: Polyglyceryl-6 lauric acid ester (MW: 548 g/mol)

Additive L: Polytetrahydrofuran polytetramethylene ether glycol; MW: 250 g/mol).

Incidentally, the additive B corresponds to a compound represented by Formula (I) in which $R^1$ is H and $R^2$ is a $C_1$ to $C_{18}$ linear alkyl group, a $C_3$ to $C_{18}$ branched alkyl group, or a $C_2$ to $C_{18}$ linear alkenyl group; n is an integer 2 to 20; and m, p, q, and r are all 0. In addition, the additives C to F correspond to compounds represented by Formula (I) in which $R^1$ and $R^2$ are both H; n is an integer 2 to 40; and m and p are both 0 and q and r are both 1. The additive G corresponds to a compound represented by Formula (I) in which $R^1$ is a $C_1$ to $C_{18}$ linear alkyl group, a $C_3$ to $C_{18}$ branched alkyl group, or a $C_2$ to $C_{18}$ linear alkenyl group and $R^2$ is H; n is an integer 2 to 20; and m and p are both 0 and q and r are both 1. The additives H to K correspond to compounds represented by Formula (I) in which $R^1$ is a $C_1$ to $C_{18}$ linear alkyl group, a $C_3$ to $C_{18}$ branched alkyl group, or a $C_2$ to $C_{18}$ linear alkenyl group and $R^2$ is H; n is an integer 2 to 20; and m, q, and r are all 1 and p is 0. The additive L corresponds to a compound represented by Formula (I) in which $R^1$ and $R^2$ are both H; n is an integer 2 to 20; and m, p, and q are all 0 and r is 2.

[Measurement of Secondary Particle Size of Polishing Abrasive Grain]

The average secondary particle size (unit: nm) of the polishing abrasive grains (colloidal silica) was measured as the volume average particle size (volume-based arithmetic average diameter; Mv) for the polishing abrasive grain sample using a dynamic light scattering type particle size distribution measuring apparatus (manufactured by Nikkiso Co., Ltd.: UPA-UT151). The measurement results on the secondary particle size of the polishing abrasive grains are recorded in Table 1 and Table 2.

[Measurement of Surface Zeta Potential]

The surface zeta potential of the polishing abrasive grains contained in the polishing composition was measured by the multiple frequency electro-acoustic method using an interfacial potential analyzer (manufactured by Colloidal Dynamics LLC: Zeta Probe Analyzer). The measurement results on the surface zeta potential are recorded in Table 1 and Table 2.

[Measurement of Silanol Group Density on Surface of Polishing Abrasive Grain]

First, colloidal silica as a solid component was weighed by 1.50 g and placed in a 200 mL beaker, about 100 mL of pure water was added to the colloidal silica to form a slurry, and then 30 g of sodium chloride was added to and dissolved in the slurry. Subsequently, 1 N hydrochloric acid was added to the slurry to adjust the pH of the slurry to about 3.0 to 3.5, and then pure water was added to the slurry to set the volume of the slurry to 150 mL. The pH of this slurry was adjusted to 4.0 with a 0.1 N sodium hydroxide solution at 25° C. and the volume V (unit: L) of the 0.1 N sodium hydroxide solution required to raise the pH of the slurry from 4.0 to 9.0 was measured by pH titration using an automatic titrator (manufactured by Hiranuma Inc.: COM-1700). The silanol group density on the surface of the polishing abrasive grains can be calculated by the following equation. The measurement results on the silanol group density on the surface of the polishing abrasive grains are respectively recorded in the columns of polishing abrasive grains a to polishing abrasive grains c in the details of the respective components ([polishing abrasive grains and additive molecules]) described above.

$$\rho = (c \times V \times N_A \times 10^{-21})/(C \times S) \qquad \text{[Equation. 1]}$$

In the equation,

ρ denotes the silanol group density on the surface of the polishing abrasive grains (unit: groups/nm$^2$);

c denotes the concentration of sodium hydroxide solution used for titration (unit: mol/L);

V denotes the volume of sodium hydroxide solution required to raise the pH from 4.0 to 9.0 (unit: L);

$N_A$ denotes Avogadro's constant (unit: mol);

C denotes the total mass of silica (solid component) (unit: g); and

S denotes the BET specific surface area of silica (unit: nm$^2$/g).

[Measurement of Removal Rate]

The removal rate was measured when polishing was performed on a silicon-germanium ($Si_xGe_{1-x}$) (specifically x=0.75) substrate having a diameter of 300 mm (manufacturer: Silicon Valley Microelectronic, Inc.; film thickness: 1500 Å), a Poly-Si substrate having a diameter of 300 mm (manufacturer: Silicon Valley Microelectronic, Inc.; film thickness: 5000 Å), and a silicon oxide (specifically, silicon oxide derived from tetraethyl orthosilicate (TEOS)) substrate having a diameter of 300 mm (hereinafter abbreviated as "TEOS substrate"; manufacturer: Silicon Valley Microelectronic, Inc.; film thickness: 10000 A), respectively using the polishing compositions obtained above under the following polishing conditions. The measurement results on the removal rate are recorded in Table 1 and Table 2.

Polishing apparatus: Single-sided CMP polishing apparatus (FREX 300E; manufactured by EBARA CORPORATION)

Polishing pad: polyurethane pad

Rotational speed of polishing table: 90 rpm

Rotational speed of carrier: 90 rpm

Flow rate of polishing composition: 300 mL/min

Polishing time: 60 sec

Polishing pressure: 1.0 psi (about 6.9 kPa)

The thickness of the object to be polished before and after polishing was measured using a film thickness measurement system (manufactured by KLA-Tencor Corporation; ASET F5x). The removal rate was calculated by the following equation.

Removal rate={[thickness before polishing]−[thickness after polishing]}/[treatment time]

In the equation, the unit of thickness is Å, the unit of treatment time is minutes, and the unit of removal rate is (Å/min). Incidentally, 1 Å=0.1 nm.

[Calculation of Ratio Value of Removal Rate]

The polishing step was performed at the above polishing pressure (namely, 1.0 psi), and the removal rate $R_{SiGe}$ of the silicon-germanium substrate, the removal rate $R_{Si}$ of the Poly-Si substrate, and the removal rate $R_{TEOS}$ of the silicon oxide substrate at this polishing pressure were determined by the above equation, respectively. The ratio value ($R_{TEOS}/R_{SiGe}$) of the removal rate $R_{TEOS}$ of the silicon oxide substrate to the removal rate $R_{SiGe}$ of the silicon-germanium substrate and the ratio value ($R_{TEOS}/R_{Si}$) of the removal rate $R_{TEOS}$ of the silicon oxide substrate to the removal rate $R_{Si}$ of the Poly-Si substrate when the polishing pressure was 1.0 psi were calculated. These ratio values ($R_{TEOS}/R_{SiGe}$) and ($R_{TEOS}/R_{Si}$) can be used in order to indicate the polishing selectivity of the oxide to the silicon-containing material at this specific polishing pressure (namely, 1.0 psi). The polishing selectivity of the oxide to the silicon-containing material is higher as the ratio value of removal rate is higher. The removal rate ratio values ($R_{TEOS}/R_{SiGe}$) and ($R_{TEOS}/R_{Si}$) in the respective Examples and Comparative Examples are also presented in Table 1 and Table 2.

In the present specification, it should be noted that the removal rate of the polishing composition with respect to the oxide is the first removal rate R1 and the first removal rate R1 may correspond to the removal rate $R_{TEOS}$ of the silicon oxide substrate in Examples, and the removal rate of the polishing composition with respect to the silicon-containing material is the second removal rate R2 and the second removal rate R2 may correspond to the removal rate $R_{SiGe}$ of the silicon-germanium substrate or the removal rate $R_{Si}$ of the Poly-Si substrate. The ratio value (R1/R2) of the first removal rate to the second removal rate may correspond to the ratio value ($R_{TEOS}/R_{SiGe}$) of the removal rate of the silicon oxide substrate to the removal rate of the silicon-germanium substrate or the ratio value ($R_{TEOS}/R_{Si}$) of the removal rate of the silicon oxide substrate to the removal rate of the Poly-Si substrate.

TABLE 1

| | Polishing abrasive grain | | | pH | | Additive | | | Zeta po-tential (mV) | Removal rate (Å/min) | | | Removal rate ratio | |
|---|---|---|---|---|---|---|---|---|---|---|---|---|---|---|
| | Kind | Content (% by weight) | Secondary particle size (nm) | Component | pH | Kind | MW (g/mol) | Content (ppm by weight) | | $R_{SiGe}$ | $R_{Si}$ | $R_{TEOS}$ | $R_{TEOS}/R_{SiGe}$ | $R_{TEOS}/R_{Si}$ |
| Example 1 | Polishing abrasive grain a | 0.5 | 60 | HNO$_3$ | 3.0 | Additive B | 446 | 100 | 33.9 | 11 | 10 | 626 | 56.9 | 62.6 |
| Example 2 | Polishing abrasive grain a | 0.5 | 60 | HNO$_3$ | 3.0 | Additive C | 314 | 250 | 33.9 | 16 | 12 | 637 | 39.8 | 53.1 |
| Example 3 | Polishing abrasive grain a | 0.5 | 60 | HNO$_3$ | 3.0 | Additive D | 462 | 250 | 34.1 | 18 | 12 | 595 | 33.1 | 49.6 |
| Example 4 | Polishing abrasive grain a | 0.5 | 60 | HNO$_3$ | 3.0 | Additive E | 759 | 250 | 36.7 | 28 | 17 | 608 | 21.7 | 35.8 |
| Example 5 | Polishing abrasive grain a | 0.5 | 60 | HNO$_3$ | 3.0 | Additive F | 2978 | 250 | 35.7 | 19 | 15 | 574 | 30.2 | 38.3 |
| Example 6 | Polishing abrasive grain a | 0.5 | 60 | HNO$_3$ | 3.0 | Additive G | 482 | 100 | 32.9 | 26 | 17 | 598 | 23.0 | 35.2 |
| Example 7 | Polishing abrasive grain a | 0.5 | 60 | HNO$_3$ | 3.0 | Additive H | 940 | 100 | 34.5 | 28 | 45 | 556 | 19.9 | 12.4 |
| Example 8 | Polishing abrasive grain a | 0.5 | 60 | HNO$_3$ | 3.0 | Additive I | 1022 | 100 | 35.2 | 21 | 14 | 366 | 17.4 | 26.1 |
| Example 9 | Polishing abrasive grain a | 0.5 | 60 | HNO$_3$ | 2.0 | Additive E | 759 | 250 | 33.9 | 20 | 16 | 222 | 11.1 | 13.9 |
| Example 10 | Polishing abrasive grain a | 0.5 | 60 | HNO$_3$ | 4.0 | Additive E | 759 | 250 | 11.8 | 30 | 22 | 357 | 11.9 | 16.2 |
| Comparative Example 1 | Polishing abrasive grain a | 0.5 | 60 | HNO$_3$ | 3.0 | — | — | — | 34.0 | 234 | 154 | 547 | 2.3 | 3.6 |
| Comparative Example 2 | Polishing abrasive grain a | 0.5 | 60 | HNO$_3$ | 3.0 | Additive A | 92 | 2000 | 33.8 | 90 | 86 | 533 | 5.9 | 6.2 |
| Comparative Example 3 | Polishing abrasive grain b | 0.5 | 70 | HNO$_3$ | 3.0 | Additive E | 759 | 250 | −132.0 | 13 | 14 | 9 | 0.7 | 0.6 |
| Comparative Example 4 | Polishing abrasive grain c | 0.5 | 70 | HNO$_3$ | 3.0 | Additive E | 759 | 250 | 7.0 | 45 | 22 | 205 | 4.6 | 9.3 |
| Comparative Example 5 | Polishing abrasive grain a | 0.5 | 60 | HNO$_3$ | 5.0 | Additive E | 759 | 250 | −87.8 | 26 | 32 | 12 | 0.5 | 0.4 |
| Comparative Example 6 | Polishing abrasive grain a | 0.5 | 60 | HNO$_3$ | 7.0 | Additive E | 759 | 250 | −240.7 | 14 | 16 | 14 | 1.0 | 0.9 |

TABLE 2

| | Polishing abrasive grain | | | pH | | Additive | | | Zeta po-tential (mV) | Removal rate (Å/min) | | | Removal rate ratio | |
|---|---|---|---|---|---|---|---|---|---|---|---|---|---|---|
| | Kind | Content (% by weight) | Secondary particle size (nm) | Component | pH | Kind | MW (g/mol) | Content (ppm by weight) | | $R_{SiGe}$ | $R_{Si}$ | $R_{TEOS}$ | $R_{TEOS}/R_{SiGe}$ | $R_{TEOS}/R_{Si}$ |
| Example 11 | Polishing abrasive grain a | 0.5 | 60 | HNO$_3$ | 3.0 | Additive J | 432 | 100 | 26.9 | 10 | 11 | 518 | 51.8 | 47.1 |
| Example 12 | Polishing abrasive grain a | 0.5 | 60 | HNO$_3$ | 3.0 | Additive K | 548 | 100 | 28.7 | 11 | 12 | 493 | 44.8 | 41.1 |
| Example 13 | Polishing abrasive grain a | 0.5 | 60 | HNO$_3$ | 3.0 | Additive L | 250 | 100 | 28.0 | 11 | 11 | 466 | 42.4 | 42.4 |

Please refer to Examples 1 to 8 in Table 1, Examples 11 to 13 in Table 2, and Comparative Example 1 in Table 1. The other experimental conditions in Examples 1 to 8 and 11 to 13 and Comparative Example 1 are all the same or similar except that an additive having the structure represented by Formula (I) is not used in Comparative Example 1. From the experimental results, it is indicated that the removal rate ratio values ($R_{TEOS}/R_{SiGe}$) and ($R_{TEOS}/R_{Si}$) in Comparative Example 1 are 2.3 and 3.6, respectively, that is, are both less than 10. As compared to this, an additive having the structure represented by Formula (I) (namely, additive B, C, D, E, F, G, H, or I) is used in all of Examples 1 to 8, and the removal rate ratio values ($R_{TEOS}/R_{SiGe}$) and ($R_{TEOS}/R_{Si}$) in Examples 1 to 8 and 11 to 13 are all greater than 10. As can be seen from this, the polishing composition containing an additive having the structure represented by Formula (I) can significantly increase the polishing selectivity of TEOS to silicon-germanium or silicon.

Please refer to Examples 1 to 8 in Table 1, Examples 11 to 13 in Table 2, and Comparative Example 2 in Table 1. The other experimental conditions in Examples 1 to 8 and 11 to 13 and Comparative Example 2 are all the same or similar except that the additive used in Comparative Example 2 is not an additive that satisfies all the conditions of the structure represented by Formula (I). From the experimental results, it is indicated that the removal rate ratio values ($R_{TEOS}/R_{SiGe}$) and ($R_{TEOS}/R_{Si}$) in Comparative Example 2 are 5.9 and 6.2, respectively, that is, are both less than 10. Incidentally, it should be noted that the additive used in Comparative Example 2 is glycerol (weight average molecular weight: 92), the structure of glycerol is similar to the structure represented by Formula (I), the difference is that the chain segment of the main chain is relatively short, the hydrophilicity of the additive molecule is relatively strong, and the weight average molecular weight is also relatively small. As can be seen from this, the number of hydrophobic chain segments of the additive molecule excessively decreases when the weight average molecular weight of the additive molecule is excessively small or the hydrophilicity is excessively strong even if the structure of the additive used is similar, and this is insufficient to effectively increase the polishing selectivity of TEOS to silicon-germanium or silicon. In addition, the removal rate $R_{TEOS}$ (533 Å/min) of the TEOS substrate in Comparative Example 2 is slightly lower than the removal rate $R_{TEOS}$ (547 Å/min) of the TEOS substrate in Comparative Example 1 in which an additive is not used. From this, it can be seen that there is a possibility that the use of additives also leads to a decrease in the removal rate of oxides.

Please refer to Example 4 and Comparative Example 3 in Table 1. The other experimental conditions in Example 4 and Comparative Example 3 are all the same or similar except that the surface zeta potential of the polishing abrasive grains b used in Comparative Example 3 is a negative value (namely, −132.0 mV). From the experimental results, it is indicated that the removal rate ratio values ($R_{TEOS}/R_{SiGe}$) and ($R_{TEOS}/R_{Si}$) in Comparative Example 3 are 0.7 and 0.6, respectively, that is, are both far less than 10. Incidentally, it should be noted that the removal rate of the TEOS substrate has significantly decreased and thus the removal rate $R_{TEOS}$ (9 Å/min) of the TEOS substrate is lower than the removal rate $R_{SiGe}$ (13 Å/min) of the silicon-germanium substrate and the removal rate $R_{Si}$ (14 Å/min) of the Poly-Si substrate in Comparative Example 3.

Please refer to Example 4 and Comparative Example 4 in Table 1. The other experimental conditions in Example 4 and Comparative Example 4 are all the same or similar except that the silanol group density on the surface of the polishing abrasive grains c used in Comparative Example 4 is 4.5 groups/nm². From the experimental results, it is indicated that the removal rate ratio values ($R_{TEOS}/R_{SiGe}$) and ($R_{TEOS}/R_{Si}$) in Comparative Example 4 are 4.6 and 9.3, respectively, that is, are both less than 10. As can be seen from this, it is difficult to effectively increase the polishing selectivity of TEOS to silicon-germanium or silicon when polishing abrasive grains having an excessively high silanol group density is used. Furthermore, in Example 4 and Comparative Example 4, the removal rates $R_{TEOS}$ of the TEOS substrate are 608 Å/min and 205 Å/min, respectively. In other words, the removal rate $R_{TEOS}$ of the TEOS substrate in Comparative Example 4 is only about ⅓ of that in Example 4. As can be seen from this, the removal rate of the TEOS substrate significantly decreases when polishing abrasive grains having an excessively high silanol group density is used, and this increases the time required for the polishing step.

Please refer to Examples 4, 9, and 10 and Comparative Examples 5 and 6 in Table 1. The other experimental conditions in Examples 4, 9, and 10 and Comparative Examples 5 and 6 are all the same or similar except that the pH in Examples 4, 9 and 10 and Comparative Examples 5 and 6 are 2.0, 3.0, 4.0, 5.0, and 7.0, respectively. Incidentally, it should be noted that polishing abrasive grains a are used in all of these, but the surface zeta potentials of the polishing abrasive grains in Comparative Examples 5 and 6 are both negative values (−87.8 mV and −240.7 mV in Comparative Examples 5 and 6, respectively) and the surface zeta potentials of the polishing abrasive grains in Examples 4, 9, and 10 are all positive values (36.7 mV, 33.9 mV, and 11.8 mV in Examples 4, 9, and 10, respectively). As can be seen from this, the surface zeta potentials of the polishing abrasive grains also differ under different pH conditions even when the same polishing abrasive grains are used. From the experimental results, it is indicated that the removal rate ratio values ($R_{TEOS}/R_{SiGe}$) and ($R_{TEOS}/R_{Si}$) in Comparative Example 5 are 0.5 and 0.4, respectively and the removal rate ratio values ($R_{TEOS}/R_{SiGe}$) and ($R_{TEOS}/R_{Si}$) in Comparative Example 6 are 1.0 and 0.9, respectively. In other words, in Comparative Examples 5 and 6, the removal rate ratio values ($R_{TEOS}/R_{SiGe}$) and ($R_{TEOS}/R_{Si}$) are both much smaller than 10. Furthermore, in Comparative Examples 5 and 6, the removal rate of the TEOS substrate has significantly decreased and thus the removal rates $R_{TEOS}$ (12 Å/min and 14 Å/min, respectively) of the TEOS substrate are both equal to or less than the removal rates $R_{SiGe}$ (26 Å/mi and 14 Å/min, respectively) of the silicon-germanium substrate and the removal rates $R_{Si}$ (32 Å/min and 16 Å/min, respectively) of the Poly-Si substrate.

Please refer to Examples 1 to 10 in Table 1 and Examples 11 to 13 in Table 2. The polishing compositions respectively used in Examples 1 to 10 all contain polishing abrasive grains (namely, polishing abrasive grains a) that satisfy the specific silanol group density range and an additive that satisfies all the conditions of the structure represented by Formula (I) (namely, additive B, C, D, E, F, G, H, I, J, K, or L), and the pH of the polishing compositions satisfies the acidic range specified above (namely, 2.0, 3.0, or 4.0). From the experimental results, it is indicated that the removal rate ratio values ($R_{TEOS}/R_{SiGe}$) and ($R_{TEOS}/R_{Si}$) in Examples 1 to 13 are all greater than 10. As can be seen from this, the polishing selectivity of TEOS to silicon-germanium or silicon significantly increases when a polishing composition in which an additive having the structure represented by Formula (I) is combined with specific polishing abrasive grains is used under a specific pH condition. In addition, as compared to the removal rate $R_{TEOS}$ (533 Å/min) of the TEOS substrate in Comparative Example 2, the removal rates $R_{TEOS}$ (626 Å/min, 637 Å/min, 595 Å/min, 608 Å/min, 574 Å/min, and 598 Å/min, respectively) of the TEOS substrate in Examples 1 to 6 have all increased by 8% or more. As can be seen from this, the removal rate of oxides can be further increased and the time required for the polishing step is shortened by adjusting the kind and content of additive.

In summary, the polishing composition according to the present invention contains polishing abrasive grains satisfying specific conditions and an additive having a specific structure and can significantly increase the polishing selectivity of an oxide to a silicon-containing material in a specific pH environment. When an object to be polished containing a silicon-containing material and an oxide is polished using the polishing composition according to the present invention, the silicon-containing material can be used as a polishing stop layer at the time of oxide polishing. Hence, the surface flatness of the object to be polished can be improved, the complexity of process can be simplified, and the time and cost required for production can be decreased. Furthermore, in the polishing composition according to the present invention, the removal rate of an oxide can be adjusted by adjusting the kind and content of additive. For example, the removal rate of an oxide can be further increased, and the time required for the polishing step can be shortened.

In addition, the polishing composition according to the present invention can be used in a chemical mechanical polishing process and is useful to obtain a substrate having a flat surface. Accordingly, the polishing composition has industrial applicability.

The present invention has been disclosed above in some preferred embodiments, but these do not limit the present invention, and those skilled in the art can, of course, make any changes and modifications without departing from the spirit and scope of the present invention. Accordingly, the scope of protection of the present invention is based on what is defined in the claims to be described later.

This application is based on the foreign language specification submitted as attachment to the application of Japanese Patent Application No. 2019-209538 filed on Nov. 20, 2019, the entire contents of which are incorporated herein by reference.

REFERENCE SIGNS LIST

Nil

What is claimed is:

1. A polishing method comprising:
polishing an object to be polished using a polishing composition, wherein the polishing composition consists of: polishing abrasive grains, an additive molecule, a pH adjusting agent and a dispersing medium; or
polishing abrasive grains, an additive molecule, a pH adjusting agent, a dispersing medium, and one other component;
wherein the polishing abrasive grains contains silica particles with a silanol group density on its surface of 0 to 3.0 groups/nm², wherein the silanol group density is calculated and determined based on the specific surface area measured by a BET method and from an amount of silanol groups measured by titration;
wherein the additive molecule has a structure represented by Formula (I):

[Chem. 1]

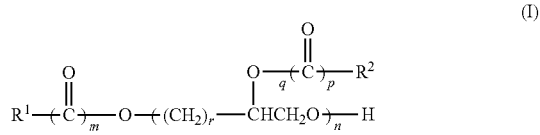

wherein in Formula (I),
$R^1$ and $R^2$ are each independently H, a $C_1$ to $C_{18}$ linear alkyl group, a $C_3$ to $C_{18}$ branched alkyl group, or a $C_2$ to $C_{18}$ linear alkenyl group;
n is an integer of 2 to 40; and
m, p, and q are each independently 0 or 1, r is an integer of 0 to 2, $R^1$ is a $C_1$ to $C_{18}$ linear alkyl group, a $C_3$ to $C_{18}$ branched alkyl group, or a $C_2$ to $C_{18}$ linear alkenyl group when m is 1, and $R^2$ is a $C_1$ to $C_{18}$ linear alkyl group, a $C_3$ to $C_{18}$ branched alkyl group, or a $C_2$ to $C_{18}$ linear alkenyl group when p is 1;
wherein the pH adjusting agent is used to adjust a pH of the polishing composition to a range of 2.1 or more and 3.9 or less;
wherein the one other component is one or more selected from the group consisting of an oxidizing agent, a metal anticorrosive, an antiseptic agent, and an antifungal agent; and
wherein a material for the object to be polished includes an oxide and a silicon-containing material, wherein the silicon-containing material is represented by $Si_xGe_{1-x}$ where x=0.1 to 1, and
wherein the polishing method has a ratio value R1/R2 of the first removal rate (R1) to the second removal rate (R2) of 10 or more when a polishing pressure is 1.0 psi, wherein the first removal rate R1 is the removal rate of the polishing composition with respect to the oxide and the second removal rate R2 is a removal rate of the polishing composition with respect to the silicon-containing material.

2. The polishing method according to claim 1, wherein the polishing composition has a content of the additive molecule that is 50 to 10,000 ppm by weight with respect to a total weight of the polishing composition.

3. The polishing method according to claim 1, wherein the additive molecule has a weight average molecular weight of 100 to 10000.

4. The polishing method according to claim 1, wherein in Formula (I):
$R^1$ is H and $R^2$ is a $C_1$ to $C_{18}$ linear alkyl group, a $C_3$ to $C_{18}$ branched alkyl group, or a $C_2$ to $C_{18}$ linear alkenyl group;
n is an integer of 2 to 20; and
m, p, q, and r are all 0.

5. The polishing method according to claim 1, wherein in Formula (I):
$R^1$ and $R^2$ are both H;
n is an integer of 2 to 40;
m and p are both 0; and
q and r are both 1.

6. The polishing method according to claim 1, wherein in Formula (I):
$R^1$ is a $C_1$ to $C_{18}$ linear alkyl group, a $C_3$ to $C_{18}$ branched alkyl group, or a $C_2$ to $C_{18}$ linear alkenyl group and $R^2$ is H;

n is an integer of 2 to 20;
m and p are both 0; and
q and r are both 1.

7. The polishing method according to claim 1, wherein in Formula (I):
$R^1$ is a $C_1$ to $C_{18}$ linear alkyl group, a $C_3$ to $C_{18}$ branched alkyl group, or a $C_2$ to $C_{18}$ linear alkenyl group and $R^2$ is H;
n is an integer of 2 to 20;
m, q, and r are all 1; and
p is 0.

8. The polishing method according to claim 1, wherein in Formula (I):
$R^1$ and $R^2$ are both H;
n is an integer of 2 to 20;
m, p, and q are all 0; and
r is 2.

9. The polishing method according to claim 1, wherein the polishing composition has a content of the polishing abrasive grains of 0.1% to 10% by weight with respect to a total weight of the polishing composition.

10. The polishing method according to claim 1, wherein a zeta potential of the polishing abrasive grains is +20 mV or more.

11. The polishing method of claim 1, wherein the polishing composition consists of polishing abrasive grains, an additive molecule, a pH adjusting agent and a dispersing medium.

12. The polishing method of claim 1, wherein the polishing composition consists of polishing abrasive grains, an additive molecule, a pH adjusting agent, a dispersing medium, and one other component.

13. A method for manufacturing a substrate, the method comprising:
preparing a substrate, wherein a surface of the substrate contains an oxide and a silicon-containing material, the silicon-containing material being represented by $Si_xGe_{1-x}$ where x=0.1 to 1; and
polishing the substrate using a polishing composition, wherein the polishing composition consists of:
polishing abrasive grains, an additive molecule, a pH adjusting agent and a dispersing medium; or
polishing abrasive gains, an additive molecule, a pH adjusting agent, a dispersing medium, and one other component;

wherein the polishing abrasive grains contain silica particles with a silanol group density on its surface of 0 to 3.0 groups/nm², wherein the silanol group density is calculated and determined based on a specific surface area measured by a BET method and from an amount of silanol groups measured by titration;

wherein the additive molecule has a structure represented by Formula (I):

[Chem. 1]

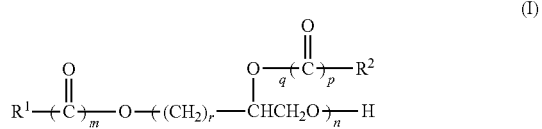

wherein in Formula (I),
$R^1$ and $R^2$ are each independently H, a $C_1$ to $C_{18}$ linear alkyl group, a $C_3$ to $C_{18}$ branched alkyl group, or a $C_2$ to $C_{18}$ linear alkenyl group;
n is an integer of 2 to 40; and
m, p, and q are each independently 0 or 1, r is an integer of 0 to 2, $R^1$ is a $C_1$ to $C_{18}$ linear alkyl group, a $C_3$ to $C_{18}$ branched alkyl group, or a $C_2$ to $C_{18}$ linear alkenyl group when m is 1, and $R^2$ is a $C_1$ to $C_{18}$ linear alkyl group, a $C_3$ to $C_{18}$ branched alkyl group, or a $C_2$ to $C_{18}$ linear alkenyl group when p is 1;
wherein the pH adjusting agent is used to adjust a pH of the polishing composition to a range of 2.1 or more and 3.9 or less,
wherein the one other component is one or more selected from the group consisting of an oxidizing agent, a metal anticorrosive, an antiseptic agent, and an antifungal agent; and
wherein the polishing method has a ratio value R1/R2 of the first removal rate (R1) to the second removal rate (R2) of 10 or more when a polishing pressure is 1.0 psi, wherein the first removal rate R1 is a removal rate of the polishing composition with respect to the oxide and the second removal rate R2 is a removal rate of the polishing composition with respect to the silicon-containing material.

* * * * *